United States Patent [19]

Cabral, Jr. et al.

[11] Patent Number: 5,510,295
[45] Date of Patent: Apr. 23, 1996

[54] METHOD FOR LOWERING THE PHASE TRANSFORMATION TEMPERATURE OF A METAL SILICIDE

[75] Inventors: Cyril Cabral, Jr., Ossining; Lawrence A. Clevenger, Lagrangeville; Francois M. d'Heurle, Ossining; James M. E. Harper, Yorktown Heights, all of N.Y.; Randy W. Mann, Jericho, Vt.; Glen L. Miles, Essex Junction, Vt.; Donald W. D. Rakowski, Georgia, Vt.

[73] Assignee: International Business Machines Corporation, Armonk, N.Y.

[21] Appl. No.: 145,921

[22] Filed: Oct. 29, 1993

[51] Int. Cl.⁶ .................................................. H01L 21/44
[52] U.S. Cl. ............... 437/200; 437/247; 148/DIG. 40; 148/DIG. 147
[58] Field of Search ................... 437/200, 247; 148/DIG. 3, DIG. 40, DIG. 147

[56] References Cited

U.S. PATENT DOCUMENTS

| | | | |
|---|---|---|---|
| 4,777,150 | 10/1988 | Deneuville et al. | 437/283 |
| 4,786,611 | 11/1988 | Pfiester | 437/45 |
| 4,800,177 | 1/1989 | Nakamae | 437/193 |
| 4,837,174 | 6/1989 | Peterson | 437/24 |
| 4,981,816 | 1/1991 | Kim et al. | 437/189 |
| 5,043,300 | 8/1991 | Nulman | 437/200 |
| 5,093,280 | 3/1992 | Tully | 437/184 |
| 5,102,826 | 4/1992 | Ohshima et al. | 437/200 |
| 5,108,954 | 4/1992 | Sandhu et al. | 437/200 |
| 5,122,479 | 6/1992 | Audet et al. | 437/200 |
| 5,138,432 | 8/1992 | Stanasolovich et al. | 357/71 |
| 5,457,069 | 10/1995 | Chen et al. | 437/190 |

FOREIGN PATENT DOCUMENTS

| | | |
|---|---|---|
| 4401341 | 2/1994 | Germany. |
| 58-6172 | 1/1983 | Japan. |
| 60-14475 | 1/1985 | Japan. |
| 63-276244 | 11/1988 | Japan. |
| 3009530 | 1/1991 | Japan. |

OTHER PUBLICATIONS

Y. Misawa, et al. "Silicidation of Molybdenum and Titanium Double Layers" J. Electrochem. Soc. 137(2) (Feb. 1990) pp. 713–717.

K. L. Wang et al "Refractory Metal Silicide Formation by Ion Implantation" Thin Solid Films 74 (1980) pp. 239–244.

Fann—Mei Yang, et al. "Phase Transformation of Mo and Wover Co or its alloy in contact with Si" Phase Transformations in thin films thermo.and kinetics Symp. 13–15 Apr. 1993 pp. 329–334, Mater. Res. Soc.

Fann—Mei Yang, et al. "Formation of Bilayer Shallow $MoSi_2/CoSi_2$ Salicide Contact" Jpn. J. Appl. Phys. vol. 31 (1992) pp. 1004–1011, Part 1, No. 4, Apr. 1992.

Fann—Mei Yang, et al. "Phase Transformation of Mo and Wover Co or its alloy in contact with Si" Thin Solid Films, 238 (1994) pp. 146–154.

(List continued on next page.)

Primary Examiner—George Fourson
Assistant Examiner—C. Everhart
Attorney, Agent, or Firm—Heslin & Rothenberg

[57] ABSTRACT

The phase transformation temperature of a metal silicide layer formed overlying a silicon layer on a semiconductor wafer is lowered. First, a refractory metal is disposed proximate to the surface of the silicon layer, a precursory metal is deposited in a layer overlying the refractory metal, and the wafer is heated to a temperature sufficient to form the metal silicide from the precursory metal. The precursory metal may be a refractory metal, and is preferably titanium, tungsten, or cobalt. The concentration of the refractory metal at the surface of the silicon layer is preferably less than about $10^{17}$ atoms/cm³. The refractory metal may be Mo, Co, W, Ta, Nb, Ru, or Cr, and more preferably is Mo or Co. The heating step used to form the silicide is performed at a temperature less than about 700° C., and more preferably between about 600°–700° C. Optionally, the wafer is annealed following the step of disposing the refractory metal and prior to the step of depositing the precursory metal layer. Preferably, this annealing step is performed at a wafer temperature of at least about 900° C.

31 Claims, 7 Drawing Sheets

OTHER PUBLICATIONS

Electrochem. Soc. Extended Abstr. Abstr. No. 147, Spring Meeting 1992.

Liu et al. "Growth of expitaxial $CoSi_2$ film on Si(100) substrate induced . . . " *Materials Letters* 17, 383–387 (1993).

Ben–Tzur et al. "Interfacial reactions between thin films of Ti–Ta and single . . . " *J. Vac. Science & Tech.* 5, 2721–2726 (1991).

Sakai et al. "A New Salicide Process (PASET) for Sub–half Micron CMOS" 1992 Symposium on VLSI Technology, 66–67.

Fung et al. "Localized epitaxial growth of C54 and C49 $TiSi_2$ on (111)Si" *App. Phys. Lett.* 47, 1312–1314 (1985).

Mann, R. W. and Racine, C. A., "Microstructure Control and Thermal Stability of Titanium Silicide", Electrochemical Society, Extended Abstract 272, Spring Meeting (1992).

Mann, R. W. et al, "Nucleation, Transformation and Agglomeration of C54 Phase Titanium Disilicide", Materials Research Society Symposium Proceedings, vol. 224, p. 115 (1991).

VanHoutum, Harrie and Raaijmakers, Ivo, "First Phase Nucleation and Growth of Titanium Disilicide With An Emphasis on the Influence of Oxygen", Materials Research Society Symposium, 1986.

Thompson, R. D. et al., "Effect of a Substrate on the Phase Transformations of Amorphous $TiSi_2$ Thin Films", *Journal Applied Physics* vol. 61(2) 15, Jan. 1987.

Lasky, J. B. et al., "Comparison of Transformation to Low–Resistivity Phase and Agglomeration of $TiSi_2$ and $CoSi_2$", IEEE Transactions on Electron Devices, vol. 38, No. 2, Feb. 1991.

Liu et al., "Effects of Sb on Phase Transformations of Amorphous $TiSi_2$ Thin Films", *Journal of Applied Physics* 72(2) 15 Jul. 1992.

d'Heurle, F. M. and Harper, J. M., "Alloying of $TiSi_2$", IBM Technical Disclosure Bulletin, vol. 33, No. 7, Dec. 1990.

Mann et al., "Phase Transformation Kinetics of $TiSi_2$", Materials Research Society Symposium Proceedings, vol. 311, p. 281 (1993).

Mann et al., "The C49 to C54–$TiSi_2$ Transformation in Salicide Applications", *Journal of Applied Physics*, vol. 73, No. 7, p. 3566 (1993).

Mann et al., "Low Temperature Nitridation of $TiSi_2$", Electrochemical Society, Extended Abstract, Fall Meeting 1987.

Koch, Tim, "Effects of Dopants in Polysilicon on Titanium Silicide Degradation", Electrochemical Society, Extended Abstract, Abstract No. 147, Spring Meeting 1992.

METHOD FOR LOWERING THE PHASE TRANSFORMATION TEMPERATURE OF A METAL SILICIDE

FIELD OF THE INVENTION

The present invention relates generally to integrated circuit devices and, more particularly, to a method for forming a metal silicide layer overlying a silicon layer in an integrated circuit device where the phase transformation temperature of the metal silicide has been reduced by the use of a second refractory metal.

DESCRIPTION OF THE PRIOR ART

Titanium silicide has become the most widely-used silicide in the VLSI industry for self-aligned silicide applications because of its combined characteristics of low resistivity, the ability to be self-aligned, and relatively good thermal stability. Although $TiSi_2$ has certain advantages relative to other silicides, the fact that it is a polymorphic material presents additional problems in its use. Specifically, in typical use $TiSi_2$ exists as either an orthorhombic base-centered phase having 12 atoms per unit cell and a resistivity of about 60–90 micro-ohm-cm (known in the industry as the C49 phase), or as a more thermodynamically-favored orthorhombic face-centered phase which has 24 atoms per unit cell and a resistivity of about 12–20 micro-ohm-cm (known as the C54 phase). When using the generally-accepted processing conditions for forming titanium silicide, the less-desirable, higher-resistivity C49 phase is formed first. In order to obtain the lower-resistivity C54 phase, a second high-temperature annealing step is required. This second step is disadvantageous because it can have detrimental effects on the silicide and other integrated circuit elements, especially at smaller line-widths. For example, the increasing use of dual-doped polysilicon gate structures in some devices has increased their sensitivity to additional heat cycles, as is required by the second anneal step. Also, silicon nitride peeling and cracking have been associated with the second annealing step.

The generally accepted set of processing conditions for forming titanium silicide include: (1) pre-cleaning, (2) titanium deposition, (3) silicide formation at a temperature less than about 700° C. (4), selective etching, and (5) a phase transformation anneal at a temperature greater than about 700° C. It is the phase transformation anneal that converts the dominant C49 phase to the C54 phase. The initial formation temperature is kept below 700° C. in order to minimize over-spacer bridging. The second transformation anneal is performed after any un-reacted titanium has been selectively removed and is generally performed at temperatures of 50°–200° C. above the formation temperature to insure full transformation to the C54 phase for best control of sheet resistance. However, as device line-widths and silicide film thicknesses continue to be scaled down, it becomes ever more desirable to eliminate the need for this second anneal step, as discussed further below.

It is generally accepted that the C49 phase forms first because of a lower surface energy than that of the C54 phase. In other words, the higher surface energy of the C54 phase forms a higher energy barrier to its formation. The second transformation anneal step used in the standard process above provides the additional thermal energy necessary to both overcome the nucleation barrier associated with forming the new surface and growing the crystalline structure of the newly-forming C54 phase. In VLSI applications, if the phase transformation is inhibited or fails to occur uniformly, a degradation in circuit performance is observed. In some higher-performance circuits, the RC delay associated with a poor phase transformation is typically about 5–10 percent.

A significant limitation on the C49-to-C54 phase transformation is a phenomenon known as agglomeration. If the thermal energy used to obtain the phase transformation is excessive, then a morphological degradation of the titanium silicide results, which is commonly referred to as agglomeration. As line-widths and silicide film thicknesses decrease, the thermal energy required to affect the C49-to-C54 phase transformation increases, yet the thermal energy level at which the silicide film starts to agglomerate decreases. Thus, there is an ever-shrinking process window for performing this phase transformation, making process control and uniformity more difficult to achieve.

Thus, there is a need for an improved method for forming the C54 phase of titanium silicide without requiring a second high-temperature annealing step, as in the generally-accepted process above. Eliminating the second annealing step would reduce the problems and limitations resulting from agglomeration of silicide films during the phase transformation anneal.

SUMMARY OF THE INVENTION

This need is satisfied, the limitations of the prior art overcome, and other benefits realized in accordance with the principles of the present invention by a method for forming a metal silicide overlying a silicon layer on a semiconductor wafer. According to this method, a refractory metal is disposed proximate to the surface of the silicon layer, a precursory metal (later used to form the metal silicide) is deposited in a layer overlying the refractory metal, and the wafer is heated to a temperature sufficient to form the metal silicide from the precursory metal. It should be noted that the term "precursory" is used throughout for purposes of identification and clarity only and does not itself imply any chemical properties of the metal it identifies.

In addition to the precursory metal itself, the precursory metal layer may also incorporate silicon, as for example in the known polycide process. When the precursory metal layer incorporates silicon, the final metal silicide is obtained by heating the wafer to a temperature sufficient to obtain the desired solid phase following deposition of the metal-silicon alloy (which in some cases may be stoichiometric). In addition to Si, the precursory metal layer may incorporate other elements from periodic table Groups IIB, IIIB, IVB, VB, and VIB, including B, C, N, O, Al, P, S, Zn, Ga, Ge, As, Se, Cd, In, Sn, Sb, Te, Mg, Tl, Pb and Bi.

Preferably, the phase transformation temperature of the metal silicide is lowered by the presence of the refractory metal at the surface of the silicon layer. The precursory metal may be a refractory metal, and is preferably titanium, tungsten, or cobalt. The precursory metal may also be molybdenum, nickel, platinum, or palladium. Further, the precursory metal generally forms a metal silicide having a metastable solid phase. The refractory metal is preferably a metal that is capable of forming a metal silicide, and the concentration of the refractory metal at the surface of the silicon layer is preferably less than about $10^{17}$ atoms/cm$^3$. The refractory metal may be Mo, Co, W, Ta, Nb, Ru, or Cr, and more preferably is Mo or Co. The silicon layer may be monocrystalline or polycrystalline, but is preferably polycrystalline. The heating step used to form the silicide is performed at a temperature less than about 700° C., and more preferably between about 600°–700° C.

There are several approaches for disposing the refractory metal that may be used. In general, these methods of disposition place refractory metal atoms on or within a few Angstroms of the surface, for example within about 2 Angstroms. A first preferred approach for disposing the refractory metal is by ion implantation with a dose of about $10^{12}$ to $5 \times 10^{14}$ atoms/cm$^2$, and more preferably a dose of about $10^{13}$ to $10^{14}$ atoms/cm$^2$. The preferred implant energy is about 45 to 90 KeV. In another preferred approach, the refractory metal is disposed on the surface of the silicon layer by evaporation of, say, a metal pellet. Also the refractory metal may be disposed by sputtering or by exposing the surface of the silicon layer to a solution containing ions of the refractory metal. For example, the solution may be a dilute acid solution containing HCl or nitric acid. Under all of the above disposition approaches except implantation, the thickness of the disposed refractory metal layer on the silicon surface is preferably less than about 2.0 nm, and more preferably about 0.5 to 1.5 nm.

Optionally, the wafer is annealed following the step of disposing the refractory metal and prior to the step of depositing the precursory metal layer. Preferably, this annealing step is performed at a wafer temperature of at least about 900° C., and more preferably between about 900° and 1000° C. In one approach, this annealing is performed for at least about 5 seconds using rapid thermal annealing (RTA). Alternatively, annealing in a furnace for at least about 10 minutes may be used.

In a more preferred approach to the present invention, a titanium silicide layer is formed overlying a silicon layer on a semiconductor wafer. According to this approach, a refractory metal is disposed proximate to the surface of the silicon layer, a titanium layer is deposited overlying the refractory metal, and the wafer is heated to a temperature sufficient to form the titanium silicide layer at least in part from the titanium layer. Preferably, the titanium silicide layer formed during this heating step substantially exhibits the C54 phase of TiSi$_2$. Preferably, the titanium layer is deposited to a thickness of about 25–57.5 nm, and the TiSi$_2$ layer is formed at a temperature less than about 700° C., and more preferably about 600°–700° C. Also, the refractory metal is preferably Mo, Co, or W and is preferably disposed by either ion implantation or metal evaporation. It has been found that Mo and Co give the best results, even relative to W. Ion implantation is preferably performed with an implant dose of about $10^{13}$ to $10^{14}$ atoms/cm$^2$. Preferably, the optional annealing step described above is performed.

In an alternative embodiment according to the present invention, a metal silicide is formed in a layer overlying a silicon layer on a semiconductor wafer by a method comprising the steps of depositing a precursory metal layer overlying the silicon layer, where the precursory metal layer contains a small quantity of a refractory metal, and heating the wafer to a temperature sufficient to form the metal silicide from the precursory metal layer, where the phase transformation temperature of said metal silicide is lowered by the presence of said refractory metal at the surface of said silicon layer. Preferably, the precursor metal and the refractory metal are deposited from the same source, and more preferably the atomic percentage of the refractory metal layer in the source is less than about 1 percent.

In a preferred approach according to the alternative embodiment, a titanium layer is deposited from a source of titanium which also contains a small quantity of a refractory metal. The wafer is then heated to a temperature sufficient to substantially form the C54 phase of titanium silicide. Preferably this temperature is less than about 700° C. and the atomic percentage of the refractory metal is less than about 1 atomic percent of the combined titanium and refractory metal weight.

An advantage of the present invention is that a phase transformation annealing step is eliminated. For example, with respect to titanium silicide the desired C54 phase is substantially formed directly during the titanium silicide formation step. No second phase transformation anneal is required. Also, agglomeration is essentially eliminated because the titanium silicide film is exposed to lower processing temperatures. As other advantages of the present invention, there is improved ability to control the microstructure of the final C54 phase of the silicide film, and the small grain size of the C54 phase grains may be less than the critical dimensions of the devices being fabricated.

The foregoing and other objects, features, and advantages of the invention will be apparent from the following more particular description of a preferred embodiment of the invention, as illustrated in the accompanying drawings.

BEST MODE FOR CARRYING OUT THE INVENTION

In a preferred approach according to the present invention, a titanium silicide layer having the C54 phase as the dominant phase is formed on a silicon layer by a single silicidation heating step. Because the TiSi$_2$ layer is formed having substantially the C54 phase, a second annealing step, which is required with prior methods, is not needed to transform the TiSi$_2$ from the C49 to the C54 phase. In this preferred approach a refractory metal is disposed proximate to the surface of the silicon layer, and a titanium layer is deposited over the refractory metal and the silicon surface. The wafer is then heated to a temperature of about 600° to 700° C. for a time period sufficient to form the C54 phase of titanium silicide.

Figure 1:
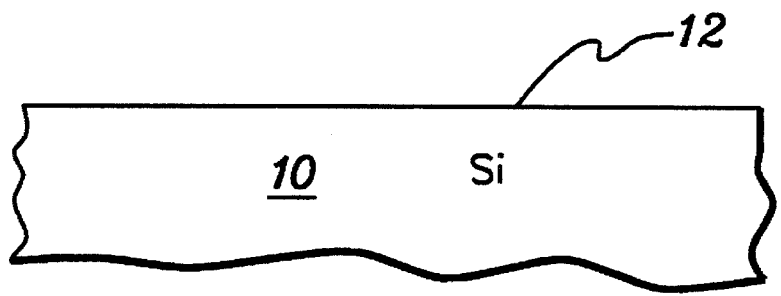
FIGS. 1–3 are cross-sections illustrating the formation of the C54 phase of titanium silicide according to a preferred approach of the present invention.

More specifically, with reference to FIG. 1, a silicon layer 10, which may be a monocrystalline silicon wafer (100) or polycrystalline silicon, is provided. Silicon layer 10 may be, for example, a polycrystalline N or P-type line or a monocrystalline N or P-type region. The refractory metal is disposed either on or near a top surface 12 of silicon layer 10, depending in part on the manner in which the metal is disposed. It is believed that the refractory metal acts to lower the surface energy barrier for the formation of the C54 phase of TiSi$_2$, and therefore, that the presence of the refractory metal at or near the surface promotes the formation of the C54 phase. It is believed that a refractory metal-silicon alloy is formed near top surface 12. It is not known with certainty whether this is a metal-silicon complex or a metal-silicon compound. In general, some of the disposed refractory metal should be on or within a few Angstroms of top surface 12. Of course, the exact disposition of the refractory metal atoms will depend upon the manner of disposition. However, for purposes of this application each manner of disposition described herein is considered to dispose refractory metal atoms proximate to the silicon surface.

Figure 2:
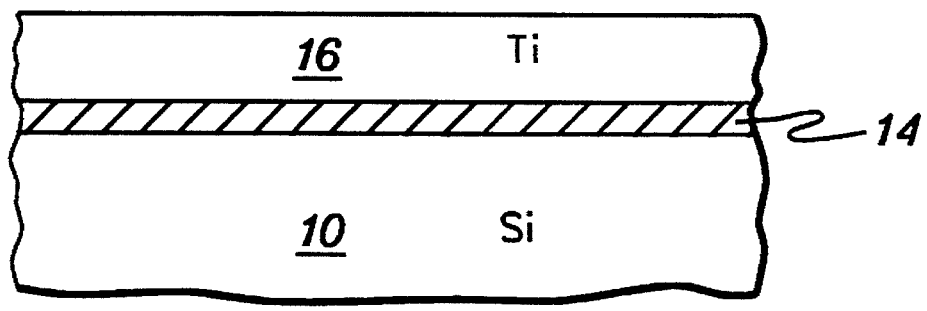

Referring now to FIG. 2, a refractory metal 14 is shown proximate to the surface of silicon layer 10. First, it should be appreciated that FIG. 2 is for illustrative purposes only and that refractory metal 14 will not necessarily cover all of top surface 12. Second, it should be noted that distribution of refractory metal 14 will vary also depending upon the manner of disposition. For example if refractory metal 14 is disposed by ion implantation, then most of the metal will be below top surface 12. On the other hand, if the metal is disposed by evaporation, then most of the metal will be disposed on top surface 12, rather than underneath it. With both the ion implantation and evaporation approaches, it is believed that it is the concentration of the refractory metal proximate to top surface 12 that lowers the C54 phase surface energy barrier. After refractory metal 14 is disposed, then a titanium layer 16 is deposited over refractory metal 14 by, say, sputtering or evaporation. For example, a thickness of 25 to 57.5 nm is used, although one skilled in the art will recognize that greater and lesser thicknesses may also be used. Top surface 12 is not explicitly shown in FIG. 2 because its position will vary according to the manner of refractory metal disposition used.

In addition to sputtering or evaporation, titanium layer 16 may also be deposited over refractory metal 14 by chemical vapor deposition. Further, when deposited by one of these methods, instead of an essentially titanium layer, a layer containing an alloy of Ti and Si may be deposited. This alloy may be stoichiometric $TiSi_2$, but this is not required, and the Ti—Si alloy may be either rich or lean in its silicon composition. When a Ti—Si alloy is deposited, the method according to the present invention is substantially similar to that described herein. Any required modifications will be recognized by one of skill in the art. Also, as used herein, the deposition of a titanium layer may alternatively refer to the deposition of a titanium-silicon alloy layer.

Figure 3:
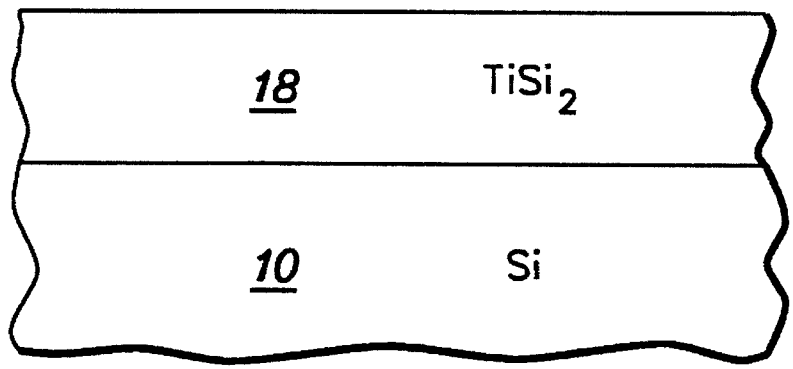

In FIG. 3, a $TiSi_2$ film 18 has been formed over silicon layer 10 by heating silicon layer 10 to a temperature between about 600° and 700° C. for a time period sufficient for the C54 phase of $TiSi_2$ to form. This time period is generally about 20 seconds for RTA to about 20 minutes for annealing in a conventional furnace. According to the method of the present invention, it is believed that the forming $TiSi_2$ film does not substantially pass through the C49 phase, but primarily goes directly to the C54 phase due to the lowered surface energy barrier.

An optional annealing step has been found beneficial for further promoting the formation of the C54 phase of $TiSi_2$, especially when forming the silicide at lower temperatures, say below about 650° C. This optional anneal is performed following the disposition of refractory metal 14 and prior to the deposition of Ti layer 16. In general, this anneal is performed at a wafer temperature of at least about 900° C., and more preferably 900°–1000° C., for a time period of at least about 5 seconds when using RTA and of generally about 10–30 minutes when using a conventional quartz furnace. A preferred anneal is at a temperature of about 900° C. for about 10 minutes in a furnace in a $N_2$ ambient. It is believed that this optional anneal may further promote the formation of the refractory metal-silicon alloy at the surface of the silicon layer, though this is not certain.

In general, it is believed that the refractory metal according to the method of the present invention may be any metal capable of forming a metal silicide. For the purposes of this application, "refractory metal" is defined to include, without limitation, the following preferred metals: Mo, Co, W, Ta, Nb, Ru, or Cr. Mo and Co provide the most significant effect, and W provides a somewhat less significant effect than Mo or Co. It is believed that the above metals will in general work with any of the herein disclosed manners of disposition, but ion implantation and evaporation of Mo, Co, and W are preferred approaches.

Discussing now the above silicidation process in greater detail, there are several approaches for disposing the refractory metal that may be used. In general, these methods of disposition place refractory metal atoms on or within a few Angstroms of top surface 12. It is believed that the refractory metal atoms closest to the silicon interface are most active, but other more distant atoms are not excluded from the meaning of proximate as used herein. For example, atoms within about 2 Angstroms (i.e. about 0.2 nm) of the surface may be the most active. A first preferred approach for disposing the refractory metal is by ion implantation with a dose of about $10^{12}$ to $5 \times 10^{14}$ atoms/cm$^2$ and even more preferably a dose of about $10^{13}$ to $10^{14}$ atoms/cm$^2$. The preferred implant energy for these cases is about 45 to 90 KeV.

One way for implanting refractory metals involves the use of the arc chamber of commercially available ion implant systems. Because the arc chamber is commonly made from, or in other cases lined with, refractory metals (such a molybdenum, niobium, tantalum, or tungsten), one method of implanting these metals is accomplished by using the arc chamber as the source of the metal to be implanted. The metal species to be implanted is selected by appropriately varying the arc chamber material and by adjusting the magnetic analyzer to select the desired atomic mass unit (AMU) of the metal species based on the known isotopes of the desired species. For example, an appropriate setting is 98 AMU for Mo, or 184 for W. Because W is also a common filament material in the ion source filament of the implant tool, W can be alternatively implanted by adjusting the analyzer magnet to 184 AMU for singly-ionized W, or to 92 AMU for doubly-ionized W. The dose and energy selected for a particular metal species will be limited by the capabilities of the ion implant system and the time devoted to performing the implant.

For the specific case of a Mo implant, a Mo arc chamber is installed into the implant system, a boron triflouride source gas ($BF_3$) is introduced into the arc chamber. It is believed that ionized $BF_3$ acts to volatilize molybdenum from the arc chamber to provide an adequate Mo ion (98Mo+) beam current of about 200 mA with an implant energy of at least about 45 KeV. Because arc chambers sometimes become coated with other materials during use in other conventional applications, it is preferred that a clean or new source chamber be used to obtain the Mo ion beam current.

When implanting Mo atoms under the above conditions (i.e. an energy of 45 KeV), it has been determined that the greatest concentration of Mo atoms occurs at a depth in the silicon layer of about 30 nm, corresponding to a peak Mo concentration of about $10^{19}$ atoms/cm$^3$. However, as discussed above, the Mo atom concentration of greatest interest is that at the surface. When using the optional anneal step above, SIMS data has indicated that the concentration of Mo atoms at the surface is about $5 \times 10^{18}$ atoms/cm$^3$. It is expected that a surface concentration of the refractory metal at the silicon interface less than about $10^{17}$ atoms/cm$^3$ may be desirable.

In another preferred approach, the refractory metal is disposed on the surface of the silicon layer by evaporation of, say, a metal pellet. This may be by either e-beam evaporation or by resistive heating (e.g. placing the pellet in a crucible that is heated by a large electrical current). When using evaporation, it is important that the thickness of the refractory metal not be too great. For example, the thickness of a Mo layer disposed on the silicon layer is preferably less than about 2.0 nm. This is not an absolute maximum thickness, but as the thickness of the Mo layer increases above 2.0 nm, peeling of the silicide film has been observed. More preferably, a Mo thickness of about 0.5–1.5 nm is used. The desired thicknesses for other metals may vary somewhat.

When evaporating such small thicknesses of refractory metal onto the silicon layer, it is sometimes difficult to control the rate of evaporation. As a result, in one evaporation approach a shutter is positioned over the evaporation metal source chamber to contain the refractory metal until ready for disposition on the silicon layer. Then, the shutter is opened and closed fairly rapidly (a so-called "flash" evaporation) to provide a thin refractory metal layer over the silicon layer. Other evaporation approaches could be used that better control the rate of evaporation.

As an alternative to evaporation of the refractory metal, the refractory metal may instead be disposed by sputtering to a thickness on the silicon layer similar to that described for evaporation above. Modifications used with a sputtering approach will be recognized by one skilled in the art.

In addition to the above, the refractory metal may be disposed on the silicon layer by exposing the surface of the silicon layer to a solution containing ions of the refractory metal. In a preferred approach, the solution is aqueous and may contain a dilute acid, such as HCl or nitric acid.

Although a preferred approach of the present invention has been described above, it is not intended that the practice of the invention be limited only to the formation of titanium silicide films. Rather, the present invention presents a method for other metal silicides that are to be formed on a silicon layer on a semiconductor wafer. According to this method, a refractory metal is disposed proximate to the surface of the silicon layer, a precursory metal is deposited in a layer overlying the refractory metal, and the wafer is heated to a temperature sufficient to form the metal silicide from the precursory metal.

It is believed that the phase transformation temperature of the metal silicide is lowered by the presence of the refractory metal at the surface of the silicon layer. For example, because of the small grain size of C54-phase TiSi$_2$ films, it is believed that the activation energy for the phase transformation to the C54 phase is lowered. The precursory metal may be a refractory metal, and is preferably titanium (as discussed above), tungsten, or cobalt. The precursory metal may also be molybdenum, nickel, platinum, or palladium. Further, the precursory metal is one that generally forms a metal silicide having more than one solid phase. The refractory metal is preferably a metal that is capable of forming a metal silicide. The refractory metal may be Mo, Co, W, Ta, Nb, Ru, or Cr, and more preferably is Mo or Co. The silicon layer may be monocrystalline or polycrystalline. The heating step used to form the silicide is performed at a temperature less than about 700° C., and more preferably between about 600°–700° C. These temperatures are preferred for TiSi$_2$, and may vary some for other metal silicides.

The several approaches for disposing the refractory metal discussed above may in general be used for the general method of the invention. Preferably, the refractory metal atoms are placed on or within a few Angstroms of the surface, and the thickness of these atoms is sufficiently thin to avoid silicide delamination due to stress effects.

As for the TiSi$_2$ approach above, the wafer is optionally annealed following the step of disposing the refractory metal and prior to the step of depositing the precursory metal layer. Preferably, this annealing step is performed at a wafer temperature of at least about 900° C., and more preferably between about 900° and 1000° C.

Figure 4:
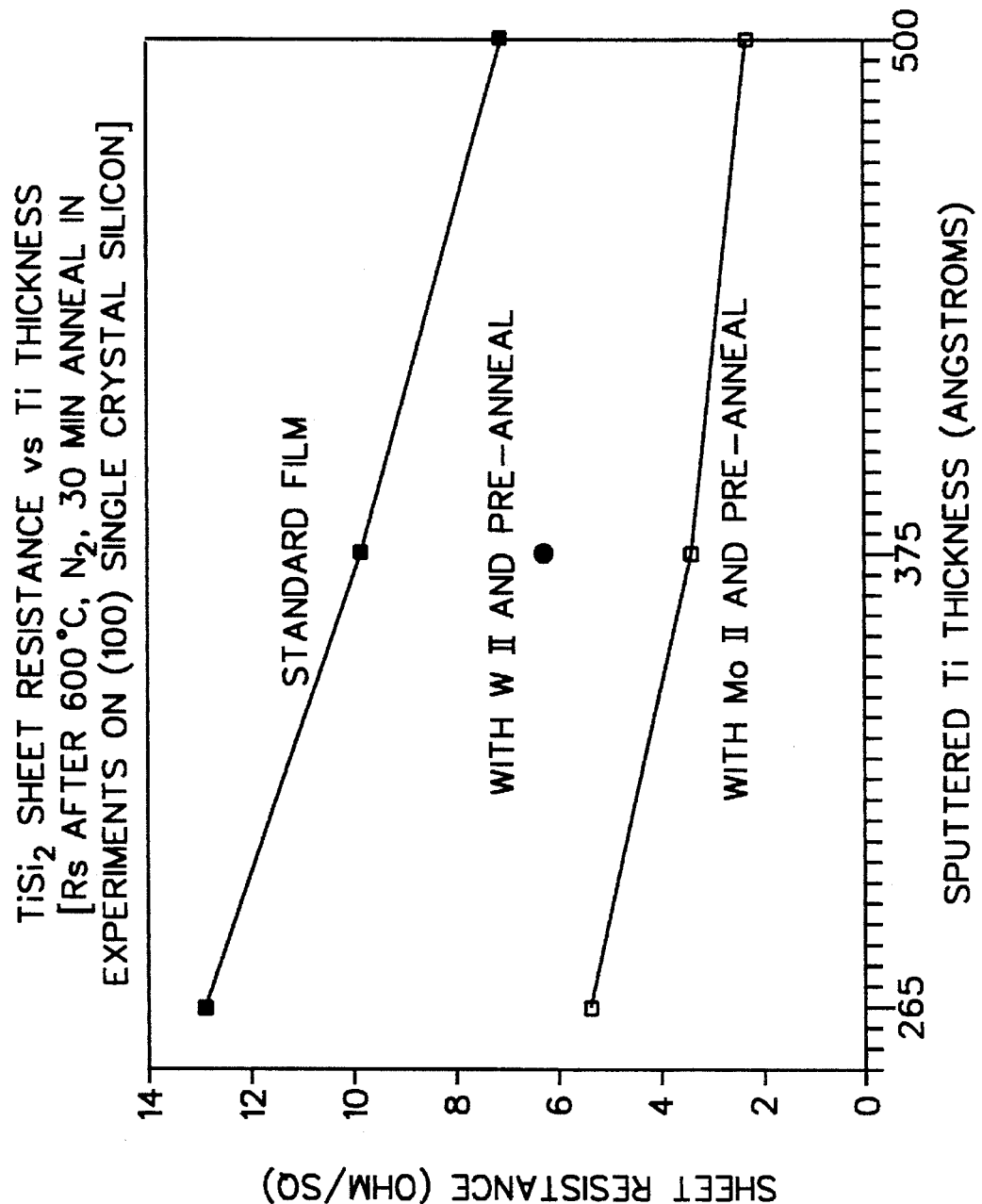
FIG. 4 is a graph of the sheet resistance of a titanium silicide layer versus sputtered titanium thickness for several process cases with and without the use of a refractory metal according to the present invention.

FIGS. 4–9 present experimental data for several TiSi$_2$ films formed according to the present invention. FIG. 4 is a graph of the sheet resistance of a titanium silicide layer versus sputtered titanium thickness for several process cases with and without the use of a refractory metal according to the present invention. The data indicated as a standard film was formed without a refractory metal and without a second phase transformation anneal. The TiSi$_2$ films corresponding to the data point for W, and the data for Mo were formed by a 600° C. anneal for 30 minutes in N$_2$ on (100) single-crystal silicon according to the present invention. An optional 5 second, 1000° C., RTA anneal was used following the implantation of the refractory metal (used for both W and Mo). The optional anneal is necessary when the TiSi$_2$ film is formed at about 600° C., but is not necessary for a formation temperature of about 700° C. The sheet resistance for each film is indicated by the data points in the graph.

Figure 5:
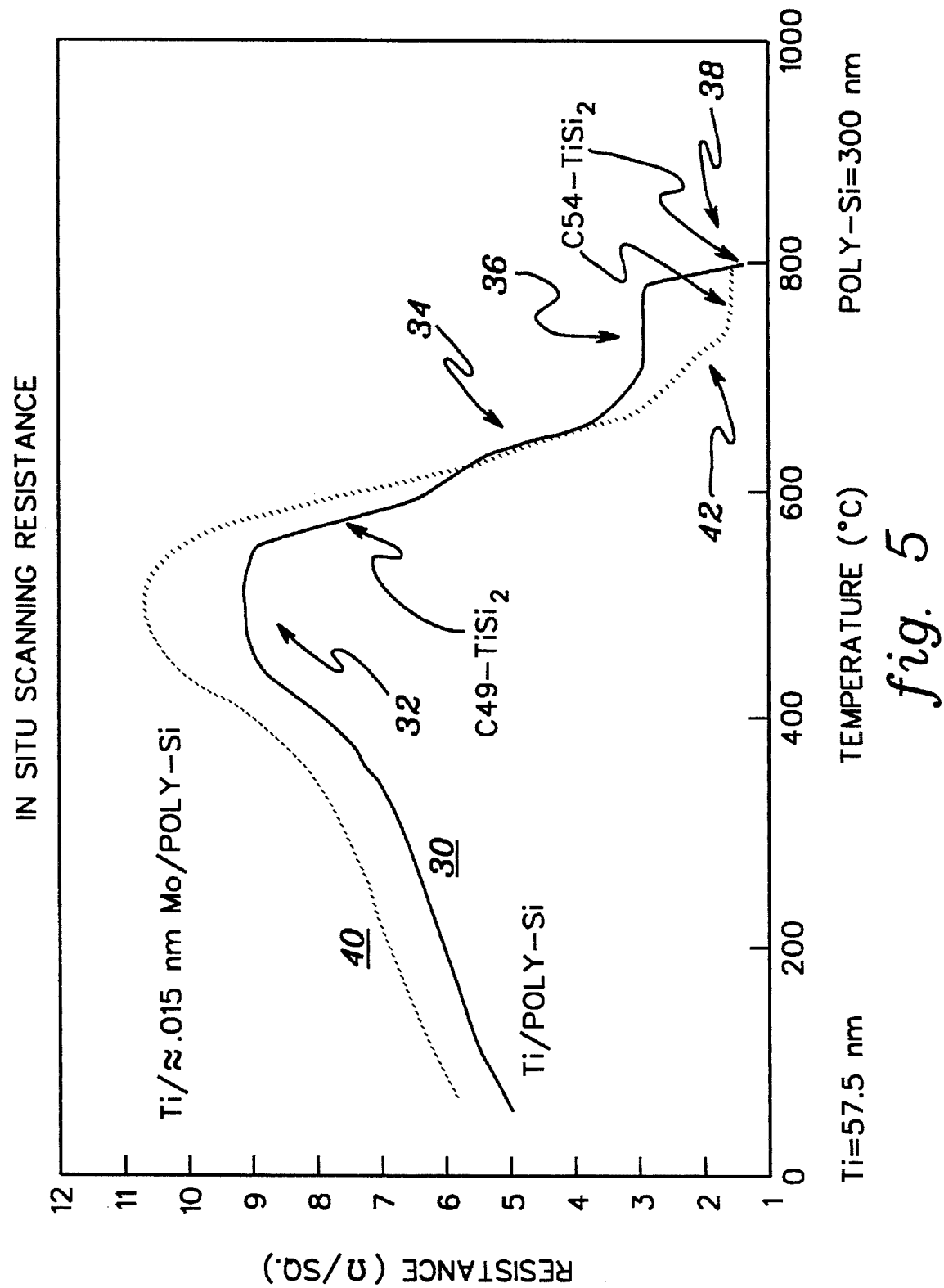
FIGS. 5–8 are in-situ scanning resistance graphs illustrating the sheet resistance of titanium silicide layers being formed for several process cases with and without the use of an evaporated or implanted refractory metal according to the present invention.
Figure 6:
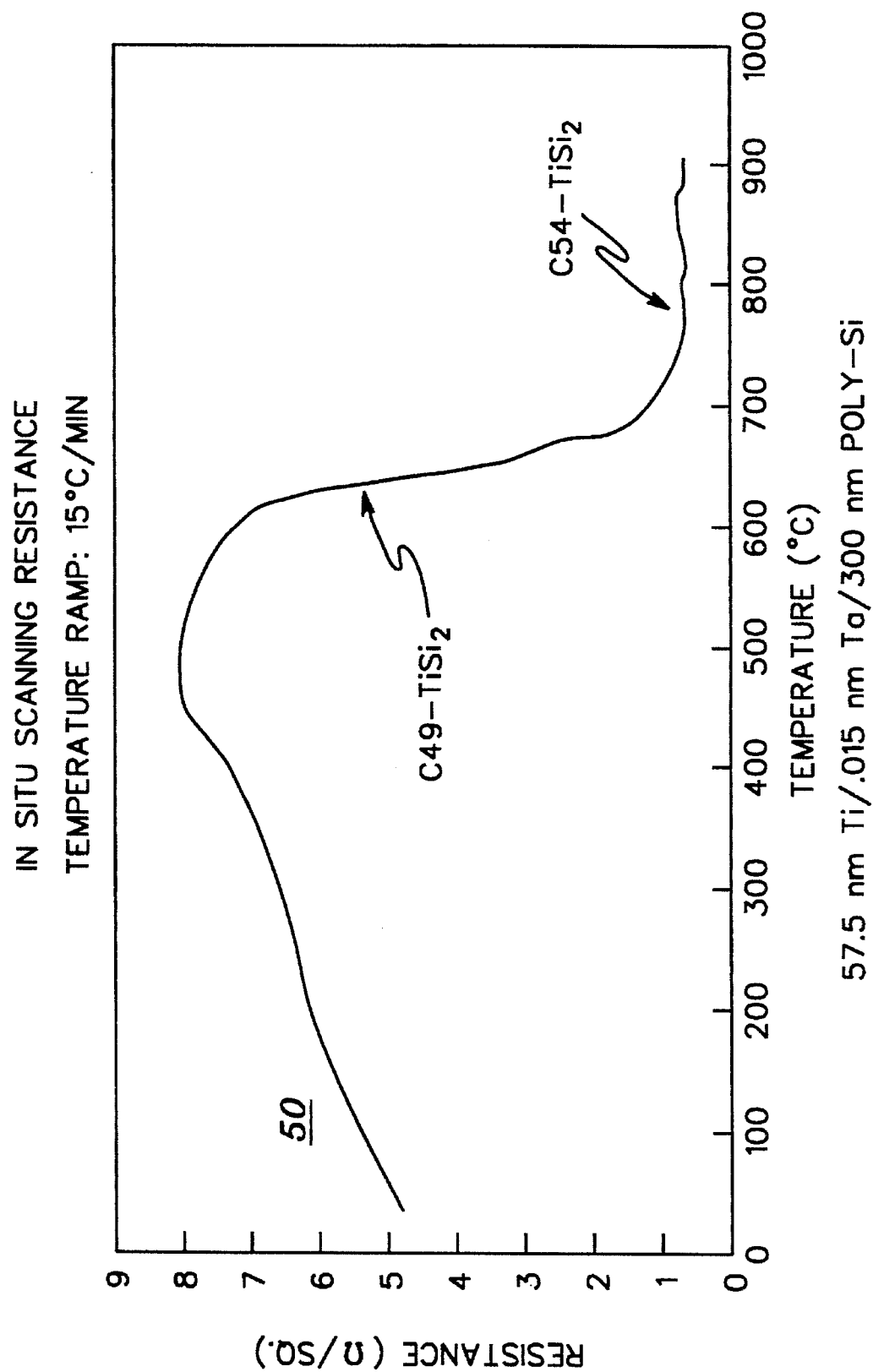
Figure 7:
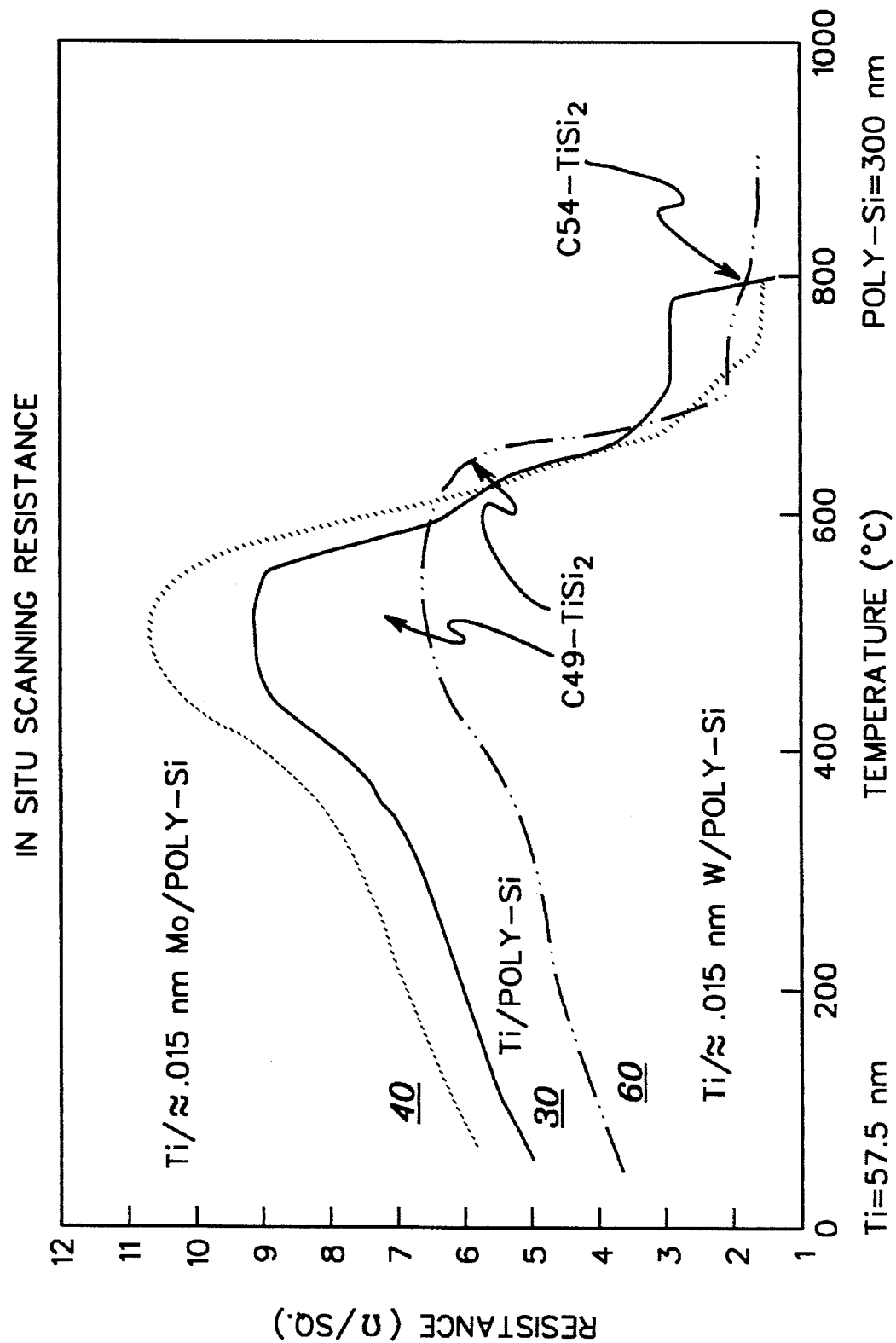
Figure 8:
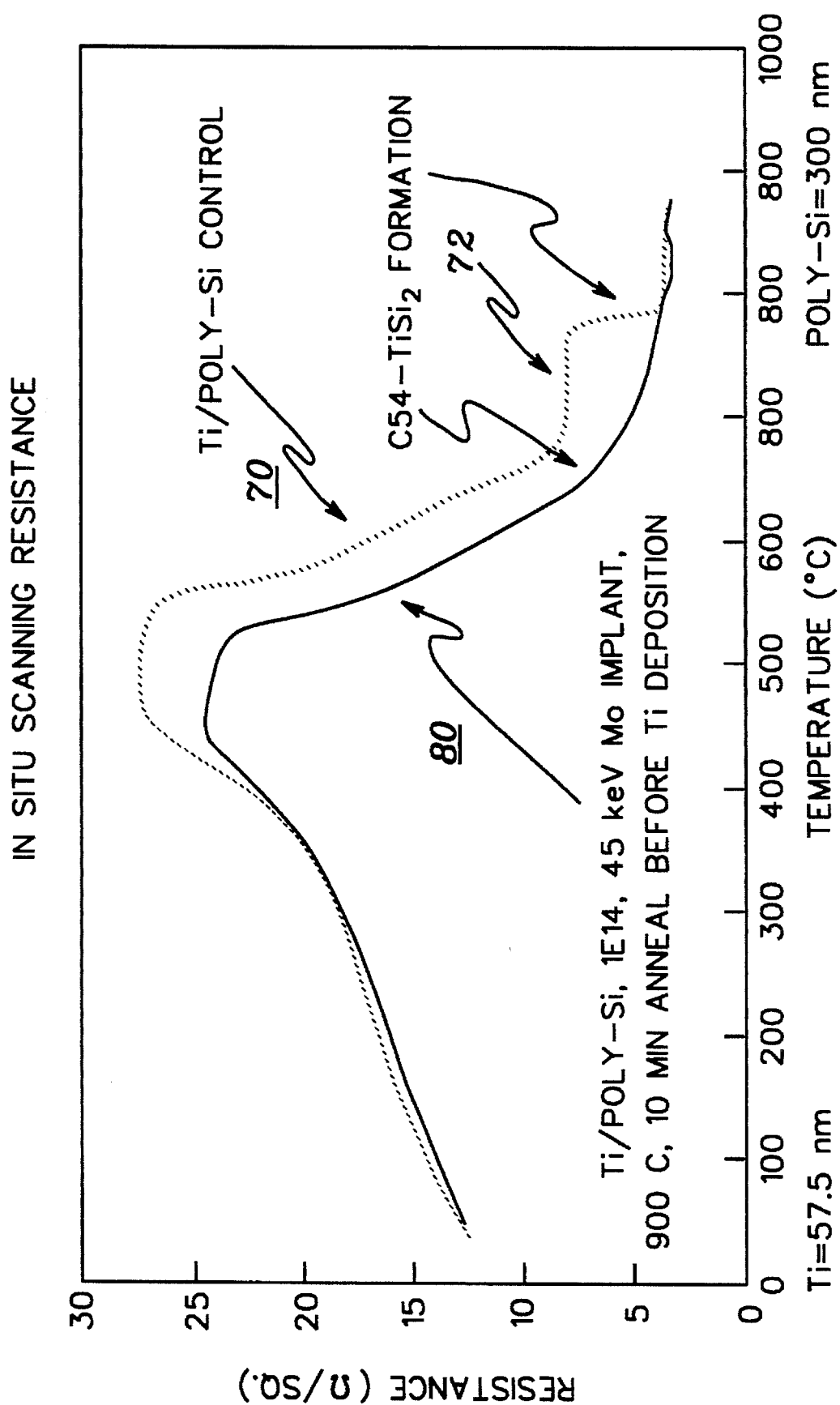

FIGS. 5–7 are in-situ scanning resistance graphs illustrating the sheet resistance of titanium silicide layers being formed for several process cases both with and without the use of an evaporated refractory metal according to the present invention. These measurements were made by continuously placing a four-point probe within a furnace during the formation of the TiSi$_2$ films. The refractory metal in FIGS. 5–7, where used, was disposed by the "flash" evaporation method described above. FIG. 8 is an in-situ scanning resistance graph for TiSi$_2$ films where an implanted, rather than evaporate, refractory metal was used. Common conditions for FIGS. 5–8 include the formation of a silicide film from a Ti layer of about 57.5 nm thickness previously deposited over an approximately 300 nm polysilicon layer. Each silicide film was formed by gradually increasing temperature at about 15° C. per minute.

Looking now at FIG. 5, curve 30 shows sheet resistance behavior for a titanium silicide film formed without the use of a refractory metal. Curve 30 exhibits the known and expected alloy effect at about point 32, with curve 30 forming a resistance peak at about 500° C. Above about 500° C., its resistance drops as indicated by arrow 34. As the temperature moves from about 500° C. to about 700° C., the forming TiSi$_2$ film is substantially in the C49 phase. At about 700° C. curve 30 flattens out into a so-called "knee" at point 36 in which the resistance is substantially constant with increasing temperature. This "knee" results from the failure of the silicide film to convert from the C49 phase to the C54 phase until even higher temperatures are reached. In contrast to curve 30, curve 40 illustrates resistance for a silicide film formed following the disposition of about 0.015 nm of Mo according to the present invention. Behavior is similar, but note that the "knee" observed for curve 30 above is substantially not present for curve 40 (see point 42). It is believed that the absence of this knee indicates that the C54 phase of TiSi$_2$ is directly formed to a substantial degree during silicidation without passing through the C49 phase.

In FIG. 6, curve 50 shows sheet resistance behavior for a forming silicide film where about a 0.015 nm Ta layer was disposed by flash evaporation according to the present invention. As for curve 40 in FIG. 5, no significant knee is observed during the formation of the C54 phase of TiSi$_2$. In FIG. 7, curve 60 illustrates sheet resistance versus temperature for a TiSi$_2$ film formed using about 0.015 nm of W according to the present invention. Curves 30 and 40 are shown for comparison with curve 60. Again, for curve 60 there is no significant knee and the C54 phase is substantially formed at a temperature less than about 700° C.

FIG. 8 is an in-situ scanning resistance graph illustrating the sheet resistance of a titanium silicide layer formed using an implanted refractory metal according to the present invention. Curve 70 is a control silicide film formed without a refractory metal, for comparison purposes, and curve 80 is a TiSi$_2$ film formed where Mo has been implanted (at a dosage of $10^{14}$ atoms/cm$^2$ and an implant energy of 45 KeV) prior to depositing Ti. After implanting Mo, an annealing step was performed at 900° C. for 10 minutes also prior to depositing Ti. As for the conventional curve 30 above, curve 70 exhibits a knee at point 72, but curve 80 does not. The absence of a knee for curve 80 indicates that the C54 phase of TiSi$_2$ is substantially formed at temperatures below about 700° C.

Figure 9:
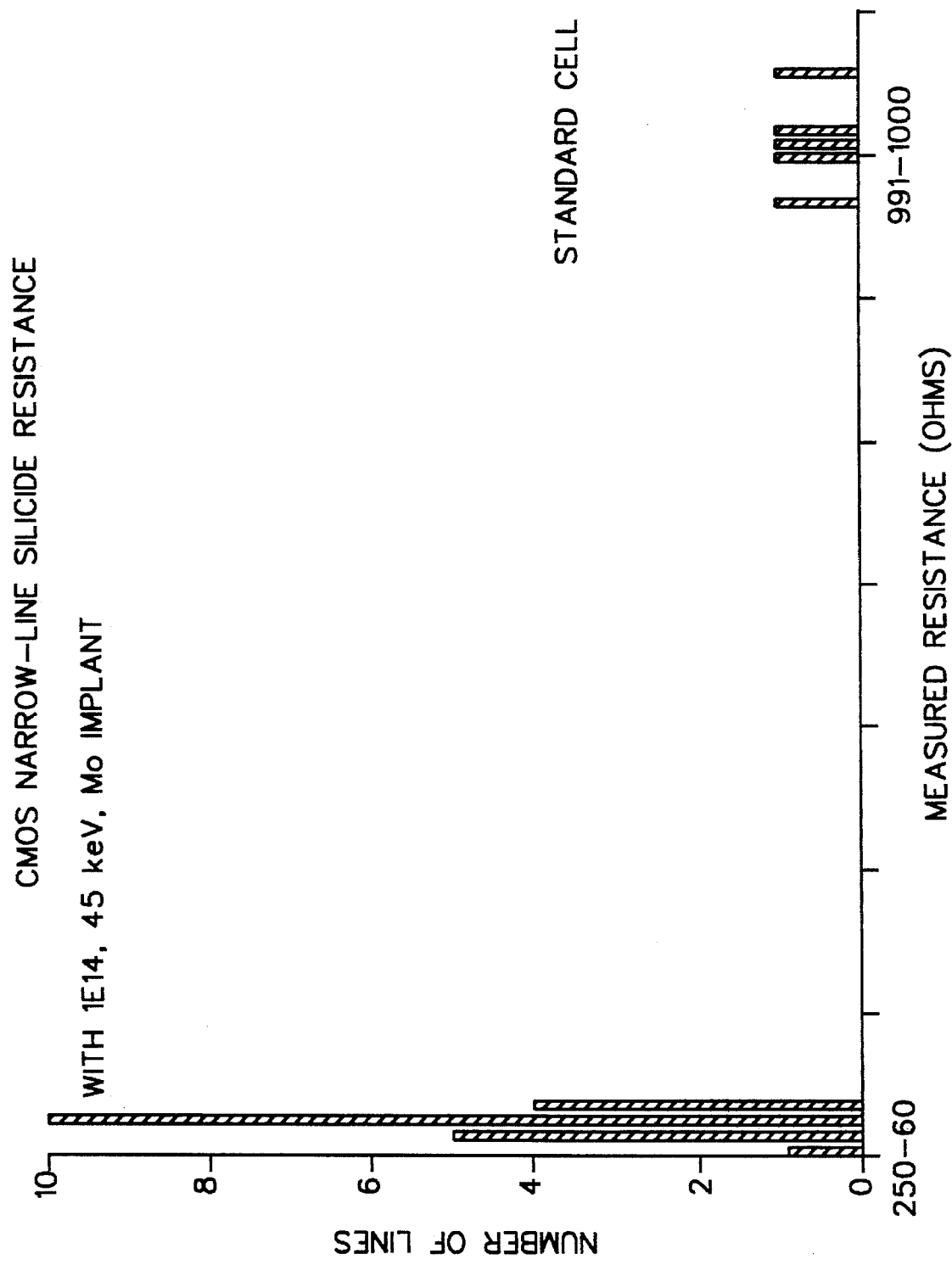
FIG. 9 is a histogram of the measured resistance of titanium silicide lines with and without a Mo ion implant according to the present invention.

FIG. 9 is a histogram of the measured resistance of titanium silicide lines with and without a Mo ion implant according to the present invention.

In addition to the data presented in FIGS. 4–9 above, there is further support that the C49 phase is substantially by-passed in silicidation by the present invention. Optical micrographs of the C54 phase of titanium silicide layers formed according to the present invention have indicated a grain size significantly smaller than in the conventional case without a refractory metal. This supports that the nucleation energy barrier of the C54 phase is significantly reduced by the method of the present invention. This becomes most important in VLSI circuits where the linewidths are less than the grain size of the C54 phase that would be formed if using the conventional approach.

Although it is believed that the method according to the present invention described above is fairly robust, there are some precautions to its use. First, heat cycles above 700° C. for extended periods must be avoided when using the present invention to prevent possible silicide instability problems. Second, if the thickness of the refractory metal layer is too great, then delamination of the silicide may result.

Another advantage of the present invention is that it does not create an amorphous silicon layer at the top surface of the silicon layer. Specifically, when using the ion implantation method to dispose the refractory metal, the optional annealing step removes any amorphous silicon that may be present. The optional anneal is not necessary with the other manners of disposition in order to avoid amorphous silicon. It is desirable to avoid the presence of amorphous silicon because it has been associated with junction leakage failures.

In an alternative embodiment according to the present invention, a metal silicide is formed in a layer overlying a silicon layer on a semiconductor wafer by a method comprising the steps of depositing a precursory metal layer overlying the silicon layer, where the precursory metal layer contains a small quantity of a refractory metal, and heating the wafer to a temperature sufficient to form the metal silicide from the precursory metal layer, where the phase transformation temperature of said metal silicide is lowered by the presence of said refractory metal at the surface of said silicon layer. Preferably, the precursory metal and the refractory metal are deposited from the same source, and more preferably the atomic percentage of the refractory metal layer in the source is less than about 1 percent. The preferred refractory metals discussed above are expected to also be useful with this embodiment.

In a preferred approach according to the alternative embodiment, a titanium layer is deposited from a source of titanium which also contains a small quantity of a refractory metal. The wafer is then heated to a temperature sufficient to substantially form the C54 phase of titanium silicide. Preferably this temperature is less than about 700° C., and the atomic percentage of the refractory metal is less than about one atomic percent of the combined titanium and refractory metal weight. The source of the titanium may be a sputtering target or evaporation pellet.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

We claim:

1. A method for forming a C54 phase titanium silicide layer on a silicon layer on a semiconductor wafer, comprising the steps of:

depositing a titanium layer on said silicon layer from a source of titanium, said titanium layer containing less than 1 atomic % of a refractory metal deposited from the same source as said titanium layer; and heating said wafer to a temperature sufficient to substantially form the C54 phase of said titanium silicide layer from said titanium layer, said temperature being less than about 700° C.

2. The method of claim 1 wherein said refractory metal is Mo, Co, W, Ta, Nb, or Cr.

3. The method of claim 1 wherein said source is a sputtering target.

4. The method of claim 1 wherein said source is an evaporation pellet.

5. A method for forming a titanium silicide layer on a silicon layer on a semiconductor wafer, comprising the steps of:

disposing a refractory metal on the surface of said silicon layer by sputtering, said refractory metal occurring in a layer less than 2 nm thick;

depositing a titanium layer over said refractory metal; and heating said wafer to a temperature sufficient to substantially form the C54 phase of said titanium silicide layer from said titanium layer, said temperature being less than about 700° C.

6. The method of claim 5 wherein said refractory metal is Mo, Ta or W.

7. The method of claim 5 further comprising the step of annealing said wafer following said step of disposing a refractory metal and prior to said step of depositing a titanium layer, said annealing being at a wafer temperature between about 900° to 1000° C.

8. A method for forming a titanium silicide layer on a silicon layer on a semiconductor wafer, comprising the steps of:

disposing a refractory metal on the surface of said silicon layer by metal evaporation, said refractory metal occurring in a layer less than 2 nm thick;

depositing a titanium layer over said refractory metal; and heating said wafer to a temperature sufficient to substantially form the C54 phase of said titanium silicide layer from said titanium layer, said temperature being less than about 700° C.

9. The method of claim 8 wherein said refractory metal is Mo, Ta or W.

10. The method of claim 8 further comprising the step of annealing said wafer following said step of disposing a refractory metal and prior to said step of depositing a titanium layer, said annealing being at a wafer temperature between about 900° to 1000° C.

11. A method for forming a titanium silicide layer on a silicon layer on a semiconductor wafer, comprising the steps of:

disposing a refractory metal on the surface of said silicon layer by exposing the surface of said silicon layer to a solution containing said refractory metal, said refractory metal occurring in a layer less than 2 nm thick;

depositing a titanium layer over said refractory metal; and heating said wafer to a temperature sufficient to substantially form the C54 phase of said titanium silicide layer from said titanium layer, said temperature being less than about 700° C.

12. The method of claim 11 wherein said refractory metal is Mo, Ta or W.

13. The method of claim 11 further comprising the step of annealing said wafer following said step of disposing a refractory metal and prior to said step of depositing a titanium layer, said annealing being at a wafer temperature between about 900° to 1000° C.

14. The method of claim 11 wherein said solution is aqueous.

15. The method of claim 11 wherein said solution contains dilute hydrochloric or nitric acid.

16. A method for forming a titanium silicide layer on a silicon layer on a semiconductor wafer, comprising the steps of:

disposing a refractory metal proximate to the surface of said silicon layer by ion implantation, with a dose of $10^{12}$ to $5 \times 10^{14}$ atoms/cm$^2$;

depositing a layer comprising titanium and silicon over said refractory metal; and heating said wafer to a temperature sufficient to substantially form the C54 phase of said titanium silicide layer from said layer comprising titanium and silicon, said temperature being less than about 700° C.

17. The method of claim 16 wherein said refractory metal is Mo, Ta or W.

18. A method for forming a titanium silicide layer on a silicon layer on a semiconductor wafer, comprising the steps of:

disposing a refractory metal on the surface of said silicon layer by sputtering, said refractory metal occurring in a layer less than 2 nm thick;

depositing a layer comprising titanium and silicon over said refractory metal; and heating said wafer to a temperature sufficient to substantially form the C54 phase of said titanium silicide layer from said layer comprising titanium and silicon, said temperature being less than about 700° C.

19. The method of claim 18 wherein said refractory metal is Mo, Ta or W.

20. A method for forming a titanium silicide layer on a silicon layer on a semiconductor wafer, comprising the steps of:

disposing a refractory metal on the surface of said silicon layer by metal evaporation, said refractory metal occurring in a layer less than 2 nm thick;

depositing a layer comprising titanium and silicon over said refractory metal; and heating said wafer to a temperature sufficient to substantially form the C54 phase of said titanium silicide layer from said layer comprising titanium and silicon, said temperature being less than about 700° C.

21. The method of claim 20 wherein said refractory metal is Mo, Ta or W.

22. A method for forming a titanium silicide layer on a silicon layer on a semiconductor wafer, comprising the steps of:

disposing a refractory metal on the surface of said silicon layer by exposing the surface of said silicon layer to a solution containing said refractory metal, said refractory metal occurring in a layer less than 2 nm thick;

depositing a layer comprising titanium and silicon over said refractory metal; and heating said wafer to a temperature sufficient to substantially form the C54 phase of said titanium silicide layer from said layer comprising titanium and silicon, said temperature being less than about 700° C.

23. The method of claim 22 wherein said refractory metal is Mo, Ta or W.

24. A method for forming a C54 phase titanium silicide layer overlying a silicon layer on a semiconductor wafer, comprising the steps of:

disposing a refractory metal proximate to the surface of said silicon layer by ion implantation with a dose of $10^{12}$ to $5 \times 10^{14}$ atoms/cm$^2$;

depositing a titanium layer overlying said silicon layer; and heating said wafer to a temperature sufficient to form said C54 phase titanium silicide layer from said titanium layer.

25. The method of claim 24 wherein the C54 phase of said titanium silicide layer is formed at a wafer temperature of less than about 700° C.

26. The method of claim 24 wherein said titanium layer is deposited to a thickness of between about 25 to 57.5 nm.

27. The method of claim 24 wherein said refractory metal is Mo, W, Ta, Nb, or Cr.

28. The method of claim 27 wherein said refractory metal is Mo, Ta, or W.

29. The method of claim 28 wherein said step of disposing said refractory metal is performed by ion implantation with an implant dose of about $10^{13}$ to $10^{14}$ atoms/cm$^2$.

30. The method of claim 29 further comprising the step of annealing said wafer following said step of disposing a refractory metal and prior to said step of depositing a titanium layer, said annealing being at a wafer temperature between about 900° to 1000° C.

31. The method of claim 24 Wherein said refractory metal is Mo.

* * * * *